Jan. 8, 1963 R. L. ANDERSON ETAL 3,072,507

SEMICONDUCTOR BODY FORMATION

Filed June 30, 1959

INVENTORS
RICHARD L. ANDERSON
JOHN C. MARINACE
GENE A. SILVEY

BY Alvin J. Riddles
ATTORNEY 3,072,507
Patented Jan. 8, 1963

3,072,507

SEMICONDUCTOR BODY FORMATION

Richard L. Anderson, Poughkeepsie, John C. Marinace, Yorktown Heights, and Gene A. Silvey, Poughkeepsie, N.Y., assignors to International Business Machines Corporation, New York, N.Y., a corporation of New York Filed June 30, 1959, Ser. No. 824,115
4 Claims. (Cl. 148—33)

This invention relates to semiconductor devices and in particular to semiconductor devices involving regions of two different types of semiconductor materials.

As the semiconductor art has developed, in the fabrication of devices in semiconductor materials it has been found advantageous to provide in certain regions of a single semiconductor device one semiconductor material having certain physical properties joined intimately to another different semiconductor material having other physical properties.

A number of advantages are achieved from such structures. Generally, there is a difference in band energy gap between the two semiconductor materials employed in the device and this difference in band width energy gap may be employed strategically placing it in specific portions of the device to achieve effects such as control of electrode capacitance and the setting up of "drift" fields within the semiconductor device. Such advantages are described and claimed in copending application, Serial No. 685,984, filed September 24, 1957, and assigned to the assignee of this application.

However, it has been found in the fabrication of single devices involving more than one semiconductor material that very close and careful control is required in order to form the transition region between one semiconductor material and the other semiconductor material.

What has been discovered is that superior transition regions in semiconductor devices made of gallium arsenide (GaAs) and germanium may be fabricated thru the use of gallium arsenide (GaAs) as a substrate and the positioning of germanium on that substrate by the technique of epitaxial deposition, thru the decomposition of a gaseous compound of the germanium.

It is an object of this invention to provide an improved technique for forming semiconductor bodies involving two semiconductor materials.

It is another object of this invention to provide an improved technique for forming semiconductor bodies involving germanium and gallium arsenide (GaAs).

It is another object of this invention to provide an improved method of forming a germanium-gallium arsenide (GaAs) diode.

The foregoing and other objects, features and advantages of the invention will be apparent from the following more particular description of a preferred embodiment of the invention as illustrated in the accompanying drawing.

It has been found to be very difficult in practice to provide a transition region in monocrystalline semiconductor material, between one semiconductor material and another semiconductor material. Generally, in devices of this type the different semiconductor materials have been of a mono-atomic type involving the more popular semiconductors germanium and silicon and the intermetallic type wherein two elements of the periodic table on either side of group 4 combine in a single monocrystalline structure. The interatomic spacings of the intermetallic semiconductors are frequently quite incompatible with those of the mono-atomic semiconductors and transition regions in single devices have been difficult to fabricate without many carrier traps for this reason.

It has been found that the intermetallic semiconductor material gallium arsenide (GaAs) has a very close interatomic spacing match with the mono-atomic semiconductor germanium and that semiconductor bodies wherein the germanium is epitaxially deposited on the gallium arsenide (GaAs) have proven to be considerably easier to fabricate than with other techniques known in the art, and, at the same time, structures of such materials have exhibited superior performance when made into semiconductor devices.

The technique of epitaxial deposition involves the pyrolytic decomposition of a gaseous compound of a transport element usually a halide, and a semiconductor material so that free semiconductor material is deposited on a substrate. When the substrate is a single crystal, the same crystalline orientation and periodicity of the substrate is maintained. The technique is practiced both in sealed systems and in systems involving a steady flow of the gas.

Figure 1:
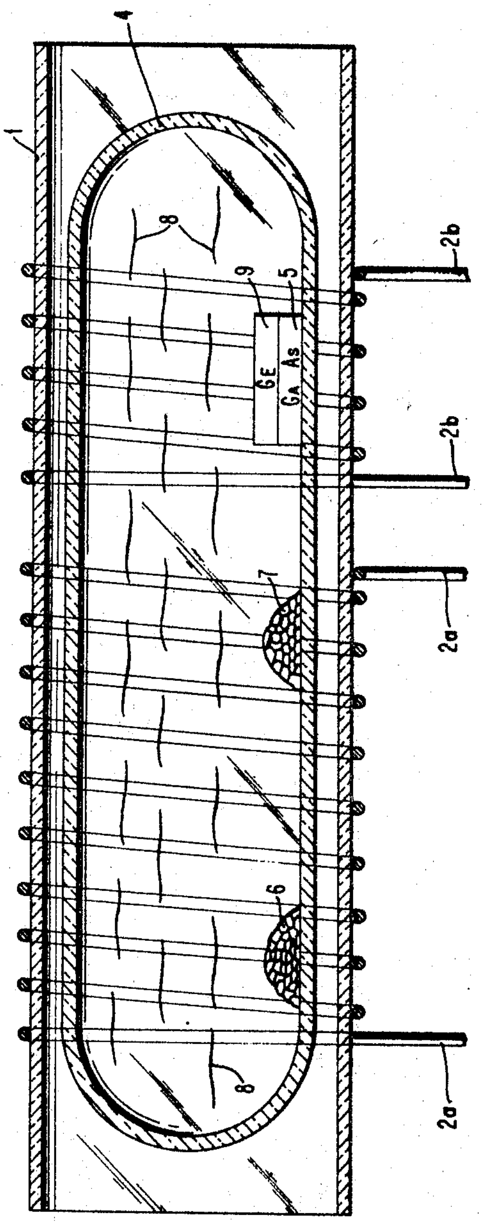
FIGURE 1 is a schematic illustration of an apparatus and reaction involved in the technique of the invention.

Referring to FIGURE 1, an illustration of an apparatus and the reaction involved in the deposition in accordance with the invention is shown. In FIGURE 1, a multiple temperature stage furnace is shown schematically. The furnace is made up of a tube 1 which for example may be of quartz or other refractory transparent material, around which are wound a plurality of independent heating coils *2a*, and *2b*. The heating coils are shown schematically as resistance windings although it will be apparent to one skilled in the art, and from subsequent discussion that any controllable source of heat which serves to provide an overall high temperature with a specific temperature difference within the furnace at individual discrete sites will serve the purpose.

A sealed container 4 is provided within the furnace to serve as an environment control and thermal insulator for the deposition reaction to be described in connection with the invention. At a particular site within the furnace, a substrate of monocrystalline gallium arsenide (GaAs) is positioned, and, in the illustration of FIGURE 1, the gallium arsenide (GaAs) substrate is labelled element 5. The monocrystalline gallium arsenide substrate 5 may be of any conductivity type and in any configuration such as a single block as illustrated or as a block with appropriate masking to prevent deposition in places that are not wanted so that matrices of devices may be simultaneously formed using the block as a common substrate. A quantity of germanium semiconductor material labelled element 6 is provided as a source and while it is not essential that the germanium 6 be in any specific form, it is shown here as a pile of finely divided material. The germanium 6 is positioned at another temperature controlled site within the sealed reaction tube 4. The conductivity type of the deposited germanium may be controlled by including the impurities in the germanium 6 or adding them during deposition from a separate controllable location. A quantity of a transport element labelled element 7 is also positioned in the reaction tube 4.

In operation a high temperature approximately 550° C. is established in the sealed tube 4 in the vicinity of the region of semiconductor material element 6. This is accomplished by applying power to coils *2a*, and *2b* such that the gallium arsenide substrate 5, the source germanium 6 and the transport element 7 are brought to a temperature sufficient to vaporize the transport element 7 and cause it to combine with the source germanium 6 forming a gas labelled element 8. The transport element 7 is preferably a halogen such as iodine. In addition to the vaporization temperature, by appropriate changing of the temperature of the substrate, as for example, by making it the lowest temperature point in the system, for example at about 420° C. it is possible to cause the halide compound of the source germanium 6 in the gas 8 to decompose thereby freeing the halogen 7 to further combine with the source material 6 and to epitaxially deposit free germanium as a monocrystalline germanium extension of the substrate 5. The deposit has been labelled element 9. Since the substrate 5 is a single crystal, and the germanium deposits epitaxially the same crystalline orientation and periodicity as the gallium arsenide crystal of the substrate is maintained.

It has been found that the inter-atomic spacing of germanium and gallium arsenide in single crystals are so closely matched that the transition region from the gallium arsenide to the germanium is far superior to that which has been found previously in the art, for structures of this type.

Figure 2:
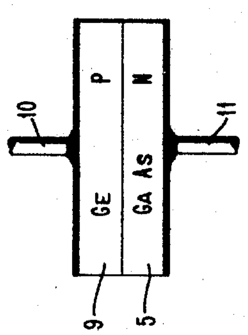
FIGURE 2 is a semiconductor device made involving the technique of the invention.

Referring now to FIGURE 2, a semiconductor diode is shown wherein N type gallium arsenide GaAs is employed as one conductivity type portion of the body, and P type germanium serves as the opposite conductivity type portion of the body. The diode structure as shown in FIGURE 2 has been found to be manufacturable in a much more controllable manner thru the technique of epitaxial deposition on a gallium arsenide substrate involving the decomposition of a halide compound of a transport element and the deposition germanium. The diode shown is an example of the various types of semiconductor devices that may be fabricated employing the invention.

The diode of FIGURE 2 is made up of gallium arsenide region 5 of one conductivity type, which, for this example is shown as N conductivity type, and the diode has a germanium region 9 of the opposite conductivity type, P in this example. Ohmic external contacts 10 and 11 are made to the P and N regions 9 and 5 respectively, for circuit connecting purposes in service.

A germanium-gallium arsenide semiconductor device such as the diode of FIGURE 2 in addition to the advantage of improved control of transition capacitance due to different band energy gap widths at the junction thereof, also has the advantages of being made of superior semiconductor material as a result of the control achieved with the epitaxial deposition process and the close match in inter-atomic crystalline spacing between the germanium and the gallium arsenide materials.

In connection with FIGURES 1 and 2 the fabrication of a very simple semiconductor structure has been illustrated however, further and more sophisticated semiconductor structures, involving different conductivity types and gradients of concentrations of conductivity types determining impurities in individual semiconductor zones may be readily fabricated by one skilled in the art, employing an extension of the teachings of the invention. For example, these structural features may be imparted thru the medium of providing other heating zones in the reaction tube by adding coils such as the coils 2*a* and 2*b*, and by adding other sources of germanium such as 6 and depositing P and N conductivity types of germanium semiconductor material on a gallium arsenide substrate by controlling the heat in the various zones so that the transport element combines with the source at one temperature and decomposes and deposits the semiconductor material on the substrate at another temperature.

While the invention has been particularly shown and described with reference to a preferred embodiment thereof, it will be understood by those skilled in the art that various changes in form and details may be made therein without departing from the spirit and the scope of the invention.

What is claimed is:

1. A semiconductor device comprising a substrate region of monocrystalline gallium arsenide semiconductor material of one conductivity-type and immediately contiguous thereto an epitaxially vapor grown germanium region of opposite conductivity-type, with an abrupt electrical junction at the interface defined by said substrate and said epitaxially vapor grown germanium region.

2. A semiconductor diode comprising a substrate region of monocrystalline gallium arsenide semiconductor material of one conductivity-type and immediately contiguous thereto a region of epitaxially vapor grown germanium of opposite conductivity-type, with an abrupt electrical junction at the interface defined by said substrate region and said epitaxially vapor grown germanium.

3. A semiconductor device comprising a substrate region of monocrystalline gallium arsenide of one conductivity-type and at least one epitaxially vapor grown region of germanium thereon, said at least one germanium region being of opposite conductivity-type to the immediately contiguous gallium arsenide region, and having an abrupt electrical junction at the interface defined by said substrate region and said at least one epitaxially vapor grown region of germanium.

4. A semiconductor single crystal structure comprising a substrate region of monocrystalline gallium arsenide and an epitaxially vapor grown region of germanium on said substrate region, said vapor grown region constituting a monocrystalline extension of said substrate region, and an abrupt electrical junction at the interface defined by said substrate region and said epitaxially vapor grown region of germanium.

References Cited in the file of this patent

UNITED STATES PATENTS

| | | |
|---|---|---|
| 2,692,839 | Christensen et al. | Oct. 26, 1954 |
| 2,798,989 | Welker | July 9, 1957 |
| 2,898,248 | Silvey et al. | Aug. 4, 1959 |
| 2,900,286 | Goldstein | Aug. 18, 1959 |
| 2,910,394 | Scott et al. | Oct. 27, 1959 |

FOREIGN PATENTS

| | | |
|---|---|---|
| 1,184,921 | France | Feb. 9, 1959 |

OTHER REFERENCES

Schillmann: Z. Naturforschg., 11*a*, pages 463–472, 1956.

Kolm et al.: Physical Review, vol. 108, No. 4, pages 965–971, Nov. 15, 1957.